United States Patent
Pan et al.

(10) Patent No.: US 7,329,582 B1
(45) Date of Patent: Feb. 12, 2008

(54) METHODS FOR FABRICATING A SEMICONDUCTOR DEVICE, WHICH INCLUDE SELECTIVELY DEPOSITING AN ELECTRICALLY CONDUCTIVE MATERIAL

(75) Inventors: James Pan, Fishkill, NY (US);
Jonathan Byron Smith, Poughkeepsie, NY (US); Ming-Ren Lin, Cupertino, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 370 days.

(21) Appl. No.: 11/154,785

(22) Filed: Jun. 15, 2005

(51) Int. Cl.
*H01L 21/335* (2006.01)
(52) U.S. Cl. ............... 438/300; 438/655; 438/656; 438/675; 438/678; 257/E21.586
(58) Field of Classification Search ......... 257/E21.586
See application file for complete search history.

(56) References Cited

U.S. PATENT DOCUMENTS

| | | | |
|---|---|---|---|
| 4,616,401 A * | 10/1986 | Takeuchi ................... 438/297 |
| 6,180,469 B1 | 1/2001 | Pramanick et al. |
| 6,326,306 B1 * | 12/2001 | Lin .......................... 438/687 |
| 2005/0093168 A1 * | 5/2005 | Tsumura et al. ............ 257/774 |
| 2005/0212058 A1 * | 9/2005 | Huang et al. ............... 257/384 |

\* cited by examiner

*Primary Examiner*—Stephen W. Smoot
(74) *Attorney, Agent, or Firm*—Ingrassia Fisher & Lorenz, P.C.

(57) ABSTRACT

Methods are provided for fabricating a semiconductor device having an impurity doped region in a silicon substrate. The method comprises forming a metal silicide layer electrically contacting the impurity doped region and depositing a conductive layer overlying and electrically contacting the metal silicide layer. A dielectric layer is deposited overlying the conductive layer and an opening is etched through the dielectric layer to expose a portion of the conductive layer. A conductive material is selectively deposited to fill the opening and to electrically contact the impurity doped region.

15 Claims, 4 Drawing Sheets

140

US 7,329,582 B1

METHODS FOR FABRICATING A SEMICONDUCTOR DEVICE, WHICH INCLUDE SELECTIVELY DEPOSITING AN ELECTRICALLY CONDUCTIVE MATERIAL

TECHNICAL FIELD OF THE INVENTION

The present invention generally relates to methods for manufacturing a semiconductor device, and more particularly relates to methods for manufacturing a small geometry semiconductor device having small, low resistance, reliable electrical contacts to impurity doped regions.

BACKGROUND OF THE INVENTION

Present day integrated circuits (ICs) are implemented by using a plurality of interconnected semiconductor devices, usually field effect transistors (FETs), also called metal oxide semiconductor field effect transistors (MOSFETs), or simply MOS transistors. For simplicity and clarity of discussion, the semiconductor devices referred to herein will be MOS transistors, although there is no intention to limit the invention to application to any one specific type of semiconductor device. An MOS transistor includes a gate electrode as a control electrode and spaced apart source and drain regions formed in the semiconductor substrate and between which a current can flow. A control voltage applied to the gate electrode controls the flow of current through a channel between the source and drain regions. As the complexity of the integrated circuits increases, more and more MOS transistors are needed to implement the integrated circuit function. As more and more transistors are designed into the IC, it becomes important to shrink the size of individual MOS transistors so that the overall size of the IC remains reasonable and the IC can be reliably manufactured. Shrinking the size of an MOS transistor implies that the minimum feature size, that is, the minimum width of a line, the minimum size of an opening, or the minimum spacing between lines, is reduced. MOS transistors have now been aggressively reduced to the point at which the gate electrode of the transistor is less than or equal to 20 nanometers (nm) in width. One of the limiting factors in the continued shrinking of integrated semiconductor devices is the resistance of contacts to doped regions such as the source and drain regions of an MOS transistor. Contact to a doped region is usually made by a conductive plug that extends through an opening in an overlying dielectric layer and electrically contacts the surface of the doped region. The conductive plug is usually formed by depositing a layer of titanium followed by a barrier layer of titanium nitride. The opening is then filled by a chemical vapor deposited layer of tungsten. As device sizes decrease, the aspect ratio of contact openings (that is, the ratio of the height of the opening to its width) increases. Titanium nitride has a relatively high resistance, and as the size of the contact opening decreases and the aspect ratio increases, the resistance of the titanium nitride component of the conductive plug becomes increasingly larger.

Accordingly, it is desirable to provide methods for fabricating semiconductor devices that have low resistance contacts to doped regions even as device sizes are reduced. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

Methods are provided for fabricating a semiconductor device having an impurity doped region in a silicon substrate. The method comprises forming a metal silicide layer electrically contacting the impurity doped region and depositing a conductive layer overlying and electrically contacting the metal silicide layer. A dielectric layer is deposited overlying the conductive layer and an opening is etched through the dielectric layer to expose a portion of the conductive layer. A conductive material is selectively deposited to fill the opening and to electrically contact the impurity doped region.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description. As stated previously, the invention will be described herein with reference to a specific semiconductor device, namely a MOS transistor, and more specifically to a MOS transistor formed on a silicon substrate. The invention is not limited to such a device, however, but rather is applicable to a wide range of semiconductor devices whether formed in and on a silicon substrate or other semiconductor material.

FIGS. 1-9 illustrate a semiconductor device, specifically a MOS transistor 140, and method steps for manufacturing such an MOS transistor in accordance with various embodiments of the invention. In these illustrative embodiments MOS device 140 is an N-channel MOS transistor, although similar method steps can be used to manufacture a P-channel MOS transistor with appropriate changes in dopant types. Likewise, similar method steps can used to manufacture complementary MOS transistors (CMOS). Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
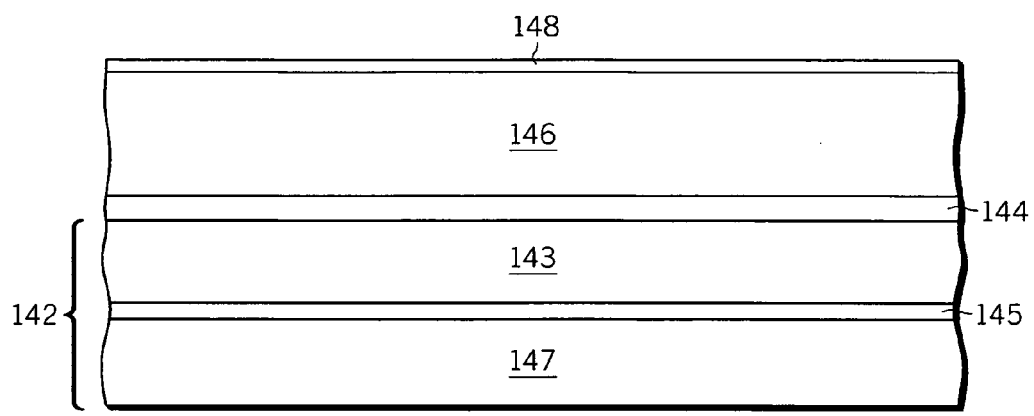
FIGS. 1-9 illustrate, in cross section, method steps for the fabrication of a semiconductor device in accordance with various embodiments of the invention.

As illustrated in FIG. 1, the manufacture of an MOS transistor 140 in accordance with an embodiment of the invention begins with providing a semiconductor substrate 142. The semiconductor substrate is preferably a silicon substrate wherein the term "silicon substrate" is used herein to encompass the relatively pure silicon materials typically used in the semiconductor industry as well as silicon admixed with other elements such as germanium and the like. Alternatively, the semiconductor substrate can be germanium, gallium arsenide, or other semiconductor material. Silicon substrate 142 may be a bulk silicon wafer or a thin layer of silicon 143 on an insulating layer 145 (commonly know as a silicon-on-insulator or SOI) that, in turn, is supported by a silicon carrier wafer 147. A layer of gate insulator 144 is formed on the surface of silicon substrate 142. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited by chemical vapor deposition (CVD), low pressure chemical vapor deposition (LPCVD), semi-atmospheric chemical vapor deposition (SACVD) or plasma enhanced chemical vapor deposition (PECVD). The gate insulator material is typically 1-10 nanometers (nm) in thickness. In accordance with one embodiment of the invention a layer of polycrystalline silicon 146 is deposited onto the layer of gate insulator. The layer of polycrystalline silicon is preferably deposited as undoped polycrystalline silicon and is subsequently impurity doped by ion implantation. A layer 148 of hard mask material such as silicon oxide, silicon nitride, or silicon oxynitride can be deposited onto the surface of the polycrystalline silicon. The polycrystalline material can be deposited to a thickness of about 100 nm by LPCVD by the hydrogen reduction of silane. The hard mask material can be deposited to a thickness of about 50 nm, also by LPCVD.

Figure 2:
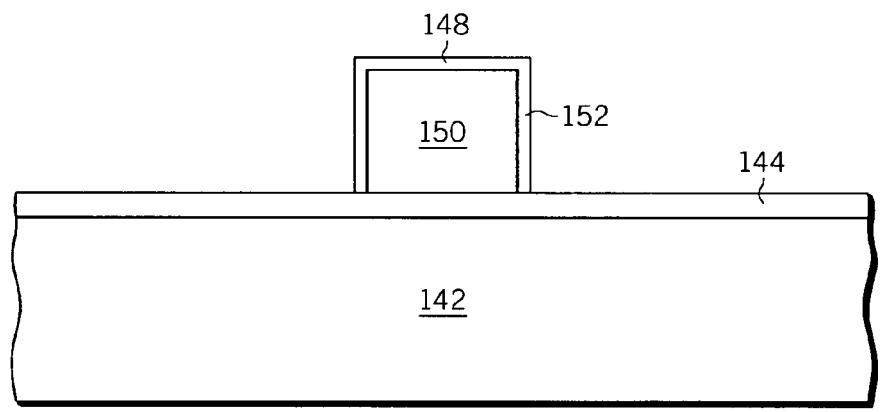

Hard mask layer 148 and underlying layer of polycrystalline silicon 146 are photolithographically patterned to form gate electrode 150 as illustrated in FIG. 2. Preferably gate electrode 150 has a width equal to the minimum line width allowable by the design rules being used to design the integrated circuit of which MOS transistor 140 is a part. The polycrystalline silicon can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry. Following the patterning of the gate electrode, a thin layer 152 of silicon oxide is thermally grown on the sidewalls of the gate electrode by heating the polycrystalline silicon in an oxidizing ambient. Layer 152 can be grown to a thickness of about 2-5 nm.

Figure 3:
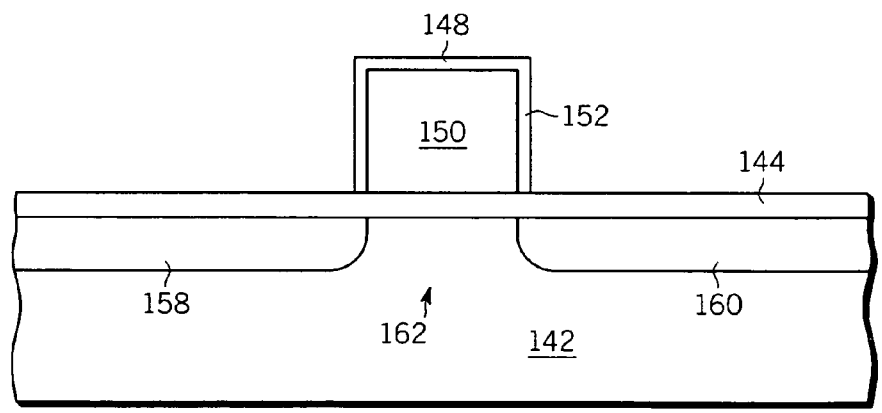

Gate electrode 150 is used as an ion implantation mask to form source region 158 and drain region 160 in silicon substrate 142 as illustrated in FIG. 3. By using the gate electrode as an ion implant mask, the source and drain regions and channel 162, defined as the substrate region between source region 158 and drain region 160, are all self aligned with the gate electrode. For an N-channel MOS transistor the source and drain regions are preferably formed by implanting arsenic ions, although phosphorus ions could also be used. Source region 158 and drain region 160 are shallow and preferably have a junction depth of less than about 20 nm and most preferably less than about 5-10 nm and are heavily impurity doped to about 10 ohms per square. As used herein, the term "shallow" as applied to the source and drain regions shall mean a region having such junction depths. The heavy impurity doping reduces the series resistance between contacts to be formed to the shallow source and drain regions and channel 162.

Figure 4:
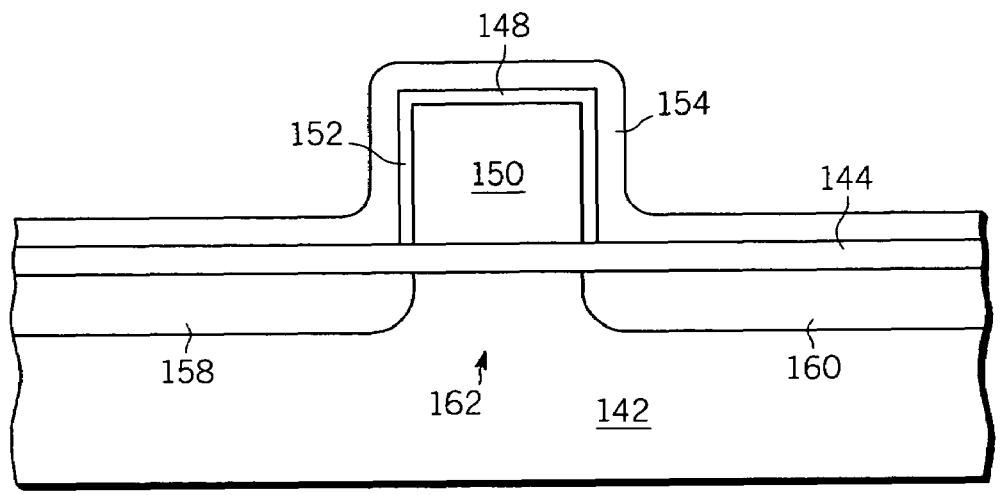

As illustrated in FIG. 4, a layer 154 of spacer forming material such as silicon oxide or silicon nitride is deposited over oxide layer 152, the portion of hard mask layer 148 remaining on the top of the gate electrode, and the remainder of gate insulator 144. The layer of spacer forming material can be deposited, for example, to a thickness of about 15 nm by LPCVD. Layer 152 serves to protect the thin gate insulator that would otherwise be exposed at the edge of gate electrode 150. Layer 152 also provides a barrier separating the polycrystalline silicon of gate electrode 150 from the overlying layer of sidewall spacer material.

Figure 5:
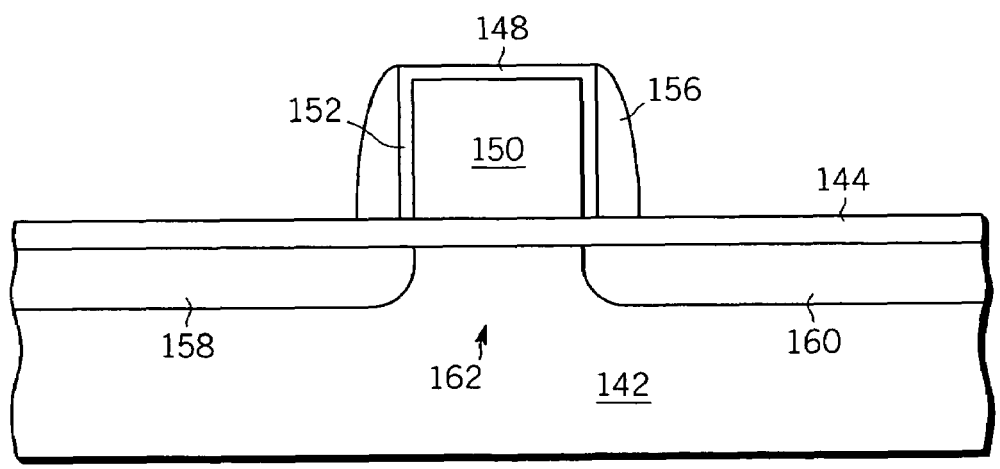

Layer 154 of spacer forming material is anisotropically etched, for example by reactive ion etching (RIE) using a $CHF_3$, $CF_4$, or $SF_6$ chemistry, to form sidewall spacers 156 on each edge of gate electrode 150 as illustrated in FIG. 5. The sidewall spacers include the thin thermally grown oxide layer 152 often referred to as a "zero spacer." The sidewall spacers formed from layer 154 and layer 152 are usually considered to be a single spacer and will be so referred to herein.

Figure 6:
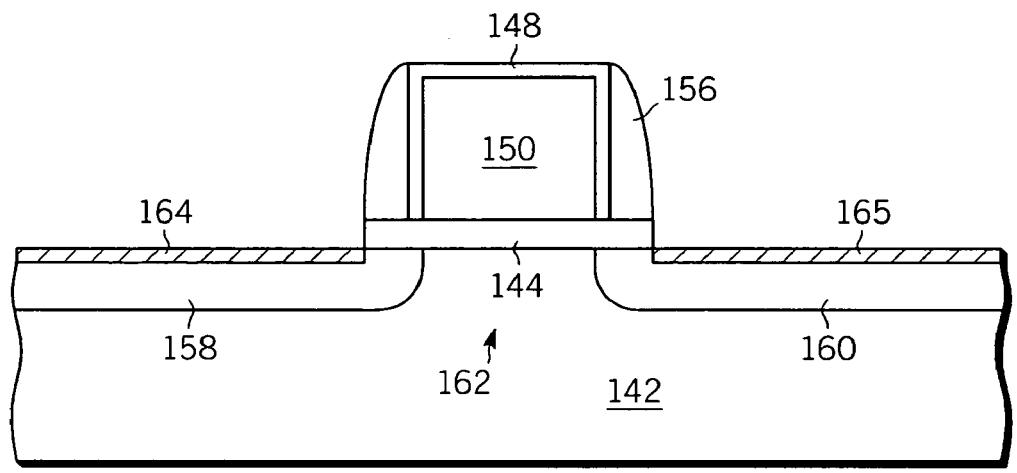

After forming sidewall spacer 156, the remainder of gate insulator layer 144 that is not covered by gate electrode 150 or sidewall spacers 156 is removed to expose the surface of the source and drain regions. A layer of silicide forming metal is deposited onto the surface of the source and drain regions and is heated, for example by rapid thermal annealing (RTA), to form a metal silicide layer 164 at the top of the source and a metal silicide layer 165 at the top of the drain region as illustrated in FIG. 6. The silicide forming metal can be, for example, cobalt, nickel, rhenium, ruthenium, or palladium, or alloys of those metals, and preferably is either cobalt or nickel. The silicide forming metal can be deposited, for example, by sputtering to a thickness of about 5-30 nm. By using a thin layer of silicide forming metal, silicide layers 164 and 165 form only to a depth of less than about 5 nm in the source and drain regions. Any silicide forming metal that is not in contact with exposed silicon, for example the silicide forming metal that is deposited on the sidewall spacers or on the remainder of hard mask material 148, does not react during the RTA to form a silicide and may subsequently be removed by wet etching in a $H_2O_2/H_2SO_4$ or $HNO_3/HCl$ solution. The sidewall spacers restrict the formation of silicide layers 164 and 165 so that the metal silicide does not contact gate electrode 150 which would cause an electrical short between the gate electrode and the source and/or drain region. Hard mask material 148 remaining on the top of gate electrode 150 prevents silicide formation on the polycrystalline silicon gate electrode during the formation of the silicide on the source and drain regions.

Figure 7:
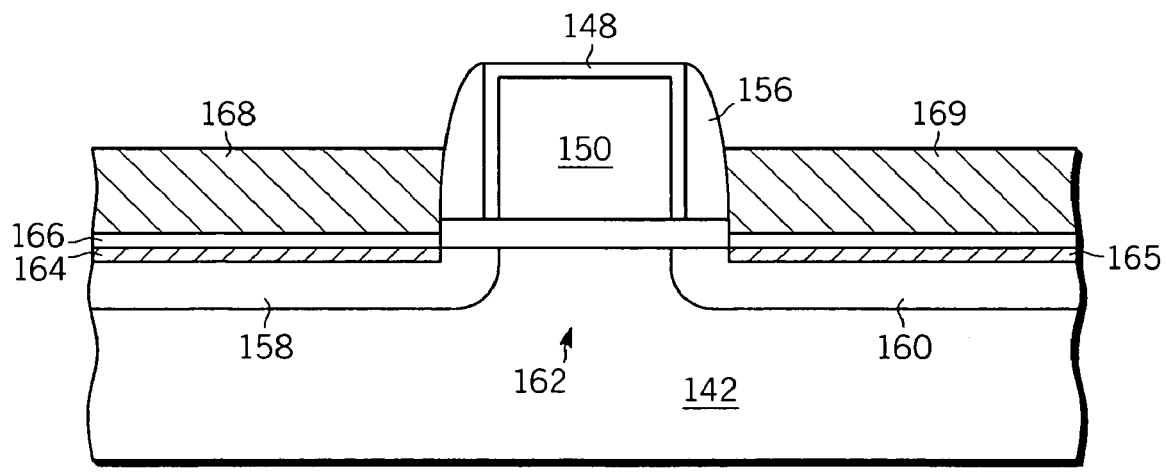

The layer of metal silicide formed on the source and drain regions is thin so as not to penetrate through the source/substrate or drain/substrate junctions. Because the metal silicide layer is thin and the source and drain regions are shallow, however, it is difficult to make reliable electrical contact to the source and drain regions with only a conventional contact plug technology. In the conventional contact plug technology (not illustrated) a layer of dielectric material such as a CVD silicon oxide would be deposited over the metal silicide and the gate electrode structure. The dielectric material could be planarized by a chemical mechanical planarization (CMP) technique and then contact opening would be etched through the dielectric material to expose a portion of the metal silicide. Titanium would be deposited through the contact openings and onto the surface of metal silicide formed on the source and drain regions. The deposition of titanium would be followed by formation of a titanium nitride layer and then a tungsten plug. Heating the Ti/TiN/W contact plug structure would cause the formation of a titanium silicide layer that could penetrate through the shallow source and drain impurity doped regions. Additionally, the TiN layer can have a relatively high sheet resistance especially in small contact openings. In accordance with an embodiment of the present invention the problem associated with the conventional contact plug technology is avoided by selectively depositing a metal layer in contact with thin metal silicide layers 164 and 165. Preferably a thin seed layer 166 is selectively deposited on thin metal silicide layers 164 and 165 and thicker layers 168 and 169 of metal are selectively deposited on the seed layer as illustrated in FIG. 7. Seed layer 166 can be, for example, a layer of palladium having a thickness of ranging from one monolayer to about 3 nm. The layer of palladium is preferably deposited by electroless deposition from a solution of palladium acetate and acetic acid. Preferably metal layers 168 and 169 selectively deposited onto the seed layer are a cobalt and tungsten metal layer. Boron and/or phosphorus may also be added to layers 168 and 169 to improve uniformity and selectivity of deposition and durability. Thicker layers 168 and 169 are preferably selectively deposited by electroless deposition from a solution such as a solution of cobalt sulphate heptahydrate, ammonium tungstate, and sodium hypophosphite with the possible addition of buffering agents, complexing agents and pH balancers. Chemicals such as dimethylamine borane can be added as a source of boron. Other electroless deposition solutions for this application, some proprietary, are available from the vendors of electroless deposition equipment. Using such a solution, thicker metal layers 168 and 169 can be selectively deposited onto seed layer 166 to a thickness of about 20-50 nm in about 15-40 minutes with a solution temperature from about 65° C. to about 75° C. Exact deposition times and temperatures depend on the particular deposition solution and the particular deposition equipment that is used. In the preferred method seed layer 166 is preferably palladium deposited by an electroless deposition process and thicker layers 168 and 169 are a metal layer including at least cobalt and tungsten, but the inventive method is not limited to these materials or to an electroless deposition process. Other conductive materials and other selective deposition techniques can also be used. For example, the thicker layers can be pure tungsten deposited by a selective CVD technique.

Figure 8:
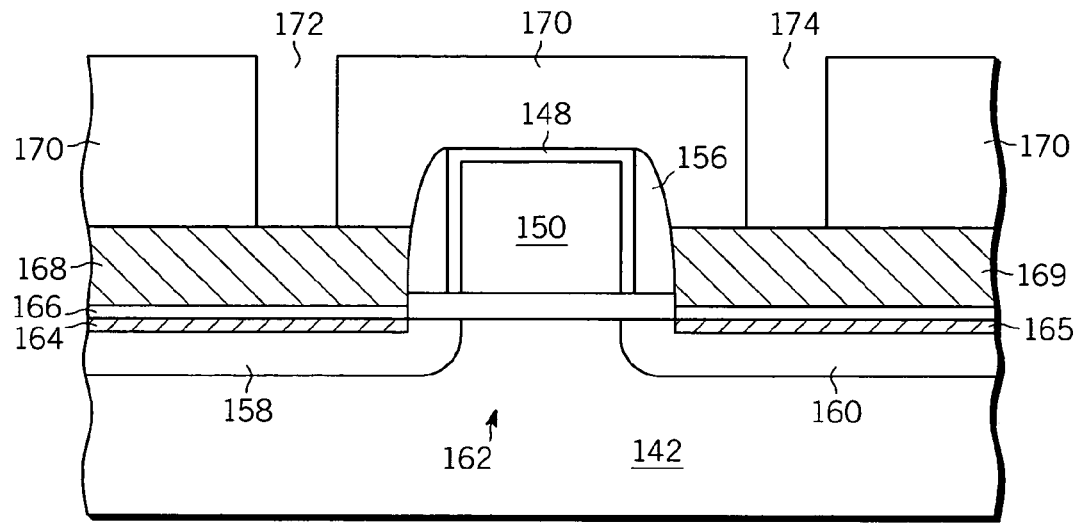

After formation of thicker layers 168 and 169, a layer 170 of dielectric material is deposited over the metal layers and gate electrode structure as illustrated in FIG. 8. Layer 170 is preferably deposited by CVD, LPCVD, SACVD, or PECVD to a thickness greater than the height of the gate electrode structure. Layer 170 can be, for example, a layer of silicon oxide deposited from a tetraethylorthosilicate (TEOS) source. The upper surface of layer 170 can be planarized, for example by CMP. Contact openings 172 and 174 are etched through layer 170 to expose a portion of thicker metal layer 168 over source region 158 and thicker metal layer 169 over drain region 160, respectively. Preferably the contact openings are minimum feature size openings.

Figure 9:
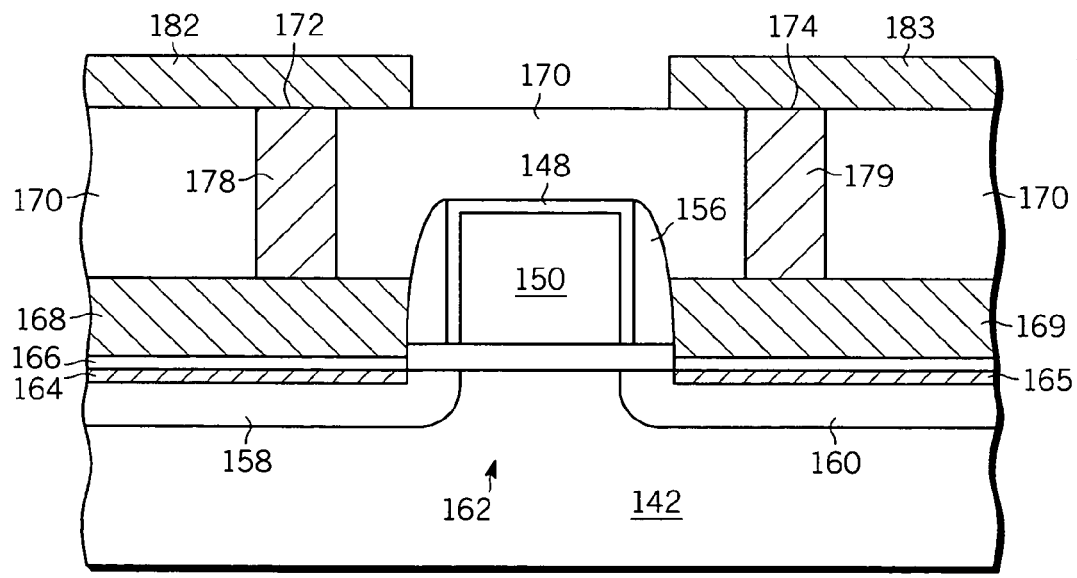

In a conventional process MOS transistor 140 would be completed by sequentially depositing, by physical vapor deposition and/or chemical vapor deposition, titanium, titanium nitride, and tungsten into the contact openings to form tungsten plugs. However, as already discussed, the use of a titanium nitride barrier layer is problematic for high aspect ratio contact openings. Accordingly, in accordance with an embodiment of the invention, the problem of conventional tungsten plugs is avoided by filling contact openings 172 and 174 by selectively depositing a conductive material. Thicker metal layers 168 and 169 act as nucleation sites for the selective deposition of the conductive material to form plugs 178 and 179 contacting thicker metal layers 168 and 169, respectively as illustrated in FIG. 9. Contact plugs 178 and 179 can be contacted by metallization 182, 183 that interconnects transistor 140 to other devices in the integrated circuit. In accordance with a preferred embodiment of the invention the selective deposition of conductive material is carried out by electroless plating from solution although other selective deposition processes can also be used. Other selective deposition processes include, for example, selective chemical vapor deposition. In accordance with a preferred embodiment of the invention plugs 178 and 179 are formed of a metal that comprises cobalt and tungsten deposited by electroless deposition. Boron and/or phosphorus may also be added to plugs 178 and 179 to improve uniformity and selectivity of deposition and durability. The cobalt tungsten, whether admixed with boron and/or phosphorus or not, can be deposited using the same electroless deposition solution and the same deposition conditions as discussed above. Metallization 182, 183 can be copper, aluminum, or other metals and alloys conventionally used in the fabrication of integrated circuits.

In accordance with a further embodiment of the invention (not illustrated) thicker layers 168 and 169 are not formed, as explained above, but rather a dielectric layer such as layer 170 is deposited directly onto the silicide layers and the gate electrode structure. The upper surface of the dielectric layer can be planarized, for example by CMP. Contact openings are etched through the dielectric layer to expose a portion of the silicide layers over source region 158 and drain region 160, respectively. A seed layer, such as a thin layer of palladium is selectively plated onto the exposed silicide layers and the contact openings are then filled by the selective deposition of a conductive metal, in the same manner as explained above, using the seed layer to nucleate the selective deposition.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating a semiconductor device in and on a silicon substrate comprising the steps of:
    forming a gate electrode overlying the silicon substrate;
    ion implanting conductivity determining dopant ions to form a shallow source region and a shallow drain region in the semiconductor substrate, the shallow source region and the shallow drain region self aligned with the gate electrode;
    forming a layer of metal silicide on each of the shallow source region and the shallow drain region;
    electrolessly depositing a layer of metal on the layer of metal silicide to form a first metal contact in electrical contact with the shallow source region and a second metal contact in electrical contact with the shallow drain region;
    depositing a dielectric layer overlying the first metal contact and the second metal contact;
    etching a first opening through the dielectric layer to expose a portion of the first metal contact and a second opening through the dielectric layer to expose a portion of the second metal contact; and electrolessly depositing an electrically conductive material to fill the first opening and the second opening by a process of selective deposition nucleated on the first metal contact and the second metal contact.

2. The method of claim 1 wherein the step of electrolessly depositing an electrically conductive material comprises the step of electrolessly depositing a metal comprising tungsten and cobalt.

3. The method of claim 2 wherein the step of electrolessly depositing a metal comprises the step of depositing a metal further comprising phosphorus.

4. The method of claim 2 wherein the step of electrolessly depositing a metal comprises the step of depositing a metal further comprising boron.

5. The method of claim 1 wherein the metal silicide forms to a depth of less than or equal to five nanometers in the shallow source and drain regions.

6. A method for fabricating a semiconductor device having a shallow impurity doped region in a silicon substrate, the method comprising the steps of:

forming a metal silicide layer electrically contacting the shallow impurity doped region;

selectively depositing a conductive layer by electroless deposition, wherein the conductive layer is overlying and electrically contacting the metal silicide layer;

depositing a dielectric layer overlying the conductive layer;

etching an opening through the dielectric layer to expose a portion of the conductive layer; and selectively depositing a metal by a process of selective electroless deposition to fill the opening by the metal nucleating on the conductive layer and electrically contacting the shallow impurity doped region.

7. The method of claim 6 wherein the step of forming a metal silicide layer comprises the step of depositing onto the impurity doped region a metal selected from the group consisting of palladium, nickel, rhenium, ruthenium, and cobalt.

8. The method of claim 6 wherein the step of selectively depositing a conductive layer comprises the step of selectively depositing a layer comprising tungsten and cobalt by electroless deposition.

9. The method of claim 6 wherein the step of selectively depositing a metal comprises the step of selectively depositing a metal comprising tungsten and cobalt.

10. The method of claim 9 wherein the step of selectively depositing a metal comprises the step of selectively depositing a metal further comprising phosphorus.

11. The method of claim 6 wherein the metal silicide layer forms to a depth of less than or equal to five nanometers in the shallow impurity doped region.

12. A method for fabricating a semiconductor device having a shallow impurity doped region in a semiconductor substrate, the method comprising the steps of:

forming a layer of metal silicide on the shallow impurity doped region;

electrolessly depositing a first metal on the layer of metal silicide to form the first metal in electrical contact with the shallow impurity doped region;

depositing a dielectric layer overlying the first metal;

etching an opening through the dielectric layer to expose a portion of the first metal; and electrolessly depositing a second metal to fill the opening by a process of selective deposition nucleated on the first metal, the second metal selectively depositing in electrical contact with the first metal.

13. The method of claim 12 wherein the step of electrolessly depositing a second metal comprises the step of electrolessly depositing a metal comprising tungsten and cobalt.

14. The method of claim 13 wherein the step of electrolessly depositing a second metal comprises the step of electrolessly depositing a metal further comprising phosphorus and boron.

15. The method of claim 12 wherein the layer of metal silicide forms to a depth of less than or equal to five nanometers in the shallow impurity doped region.

* * * * *